United States Patent
Jellus (10) Patent No.: US 7,672,498 B2
(45) Date of Patent: Mar. 2, 2010

(54) METHOD FOR CORRECTING INHOMOGENEITIES IN AN IMAGE, AND AN IMAGING APPARATUS THEREFOR

(75) Inventor: Vladimir Jellus, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1106 days.

(21) Appl. No.: 11/311,364

(22) Filed: Dec. 20, 2005

(65) Prior Publication Data

US 2006/0182363 A1    Aug. 17, 2006

(30) Foreign Application Priority Data

Dec. 21, 2004    (DE)    ........................ 10 2004 061 507

(51) Int. Cl.
G06K 9/34    (2006.01)
G06K 9/38    (2006.01)
G06K 9/40    (2006.01)
G06K 9/36    (2006.01)
G06K 9/20    (2006.01)

(52) U.S. Cl. ................. 382/131; 382/172; 382/173; 382/257; 382/263; 382/272; 382/274; 382/280; 382/282

(58) Field of Classification Search ......... 382/131, 382/132, 168, 169, 171–173, 257, 260–264, 382/266, 272, 274, 280, 282, 283, 308
See application file for complete search history.

(56) References Cited

U.S. PATENT DOCUMENTS

| | | | | |
|---|---|---|---|---|
| 4,509,074 A | * | 4/1985 | Krauss et al. | 378/98.7 |
| 4,585,992 A | * | 4/1986 | Maudsley et al. | 324/309 |
| 4,731,865 A | * | 3/1988 | Sievenpiper | 382/274 |
| 5,185,671 A | * | 2/1993 | Lieberman et al. | 348/229.1 |
| 5,224,177 A | * | 6/1993 | Doi et al. | 382/168 |
| 5,247,366 A | * | 9/1993 | Ginosar et al. | 348/256 |
| 5,268,967 A | * | 12/1993 | Jang et al. | 382/132 |

(Continued)

FOREIGN PATENT DOCUMENTS

EP    0 272 111 A2    6/1988

OTHER PUBLICATIONS

Sled, J.; Zijdenbos, A.; Evans, A., "A Nonparametric Method for Automatic Correction of Intensity Nonuniformity in MRI Data," Feb. 1998, IEEE Transactions On Medication Imaging, vol. 17, No. 1, pp. 87-97.*

(Continued)

Primary Examiner—Brian P Werner
Assistant Examiner—Anthony Mackowey
(74) Attorney, Agent, or Firm—Harness, Dickey & Pierce, P.L.C.

(57) ABSTRACT

A method is for correcting inhomogeneities in an image that is recorded from an examination object. The method includes recording an image to be corrected, calculating a correction image from the image to be corrected and correcting the recorded image with the aid of the correction image in order to produce a normalized image by multiplying the correction image by the image to be corrected. When calculating the correction images, the pixels in the vicinity of the imaged examination object are identified with the aid of a signal intensity that is lower than a limiting value. Further, these pixels are allocated signal intensities that in each case are a function of the signal intensity of the pixels in the respective neighborhood.

20 Claims, 10 Drawing Sheets

U.S. PATENT DOCUMENTS

| | | | |
|---|---|---|---|
| 5,319,551 A * | 6/1994 | Sekiguchi et al. | 382/131 |
| 5,452,367 A * | 9/1995 | Bick et al. | 382/128 |
| 5,467,404 A * | 11/1995 | Vuylsteke et al. | 382/274 |
| 5,528,703 A * | 6/1996 | Lee | 382/257 |
| 5,551,431 A * | 9/1996 | Wells et al. | 600/410 |
| 5,671,264 A | 9/1997 | Florent et al. | |
| 5,715,334 A * | 2/1998 | Peters | 382/254 |
| 5,764,792 A * | 6/1998 | Kennealy | 382/133 |
| 5,774,599 A * | 6/1998 | Muka et al. | 382/254 |
| 5,790,692 A * | 8/1998 | Price et al. | 382/133 |
| 5,793,885 A * | 8/1998 | Kasson | 382/167 |
| 5,801,962 A * | 9/1998 | Sheu et al. | 702/85 |
| 5,828,776 A * | 10/1998 | Lee et al. | 382/133 |
| 5,832,134 A * | 11/1998 | Avinash et al. | 382/257 |
| 5,835,618 A * | 11/1998 | Fang et al. | 382/132 |
| 5,900,732 A * | 5/1999 | Felmlee et al. | 324/309 |
| 5,943,433 A * | 8/1999 | Avinash | 382/131 |
| 5,959,696 A * | 9/1999 | Hwang | 348/678 |
| 5,963,675 A * | 10/1999 | van der Wal et al. | 382/260 |
| 6,088,488 A * | 7/2000 | Hardy et al. | 382/278 |
| 6,097,847 A * | 8/2000 | Inoue | 382/266 |
| 6,108,457 A * | 8/2000 | Nevis | 382/274 |
| 6,112,112 A * | 8/2000 | Gilhuijs et al. | 600/425 |
| 6,130,724 A * | 10/2000 | Hwang | 348/678 |
| 6,141,459 A * | 10/2000 | Gendel | 382/256 |
| 6,141,461 A * | 10/2000 | Carlini | 382/261 |
| 6,173,083 B1 * | 1/2001 | Avinash | 382/260 |
| 6,208,138 B1 * | 3/2001 | Lai et al. | 324/307 |
| 6,208,763 B1 * | 3/2001 | Avinash | 382/254 |
| 6,208,766 B1 * | 3/2001 | Schweyer et al. | 382/274 |
| 6,215,911 B1 * | 4/2001 | Goertler et al. | 382/264 |
| 6,333,993 B1 * | 12/2001 | Sakamoto | 382/173 |
| 6,556,720 B1 * | 4/2003 | Avinash | 382/260 |
| 6,584,216 B1 * | 6/2003 | Nyul et al. | 382/131 |
| 6,592,523 B2 * | 7/2003 | Avinash et al. | 600/443 |
| 6,628,842 B1 * | 9/2003 | Nagao | 382/266 |
| 6,658,280 B1 * | 12/2003 | Haacke | 600/410 |
| 6,668,097 B1 * | 12/2003 | Hu et al. | 382/275 |
| 6,700,131 B2 * | 3/2004 | Nishihara et al. | 250/586 |
| 6,701,025 B1 * | 3/2004 | Avinash | 382/261 |
| 6,731,821 B1 * | 5/2004 | Maurer et al. | 382/263 |
| 6,741,753 B1 * | 5/2004 | Moroney | 382/274 |
| 6,757,442 B1 * | 6/2004 | Avinash | 382/274 |
| 6,771,320 B2 * | 8/2004 | Choi | 348/625 |
| 6,771,838 B1 * | 8/2004 | Fan | 382/274 |
| 6,782,137 B1 * | 8/2004 | Avinash | 382/254 |
| 6,801,646 B1 * | 10/2004 | Pena et al. | 382/131 |
| 6,864,916 B1 * | 3/2005 | Nayar et al. | 348/224.1 |
| 6,901,173 B2 * | 5/2005 | Alderson et al. | 382/312 |
| 6,907,144 B1 * | 6/2005 | Gindele | 382/275 |
| 6,941,028 B2 * | 9/2005 | Kimmel et al. | 382/274 |
| 6,993,203 B2 * | 1/2006 | Ozawa et al. | 382/257 |
| 7,164,808 B2 * | 1/2007 | Srinivasa | 382/274 |
| 7,218,107 B2 * | 5/2007 | Fuderer | 324/309 |
| 7,218,763 B2 * | 5/2007 | Belykh et al. | 382/128 |
| 7,221,787 B2 * | 5/2007 | Luo et al. | 382/132 |
| 7,263,241 B2 * | 8/2007 | Huang et al. | 382/263 |
| 7,302,110 B2 * | 11/2007 | Chesnokov | 382/264 |
| 7,362,915 B2 * | 4/2008 | Vuylsteke | 382/274 |
| 7,469,073 B2 * | 12/2008 | Paladini et al. | 382/275 |
| 2002/0009215 A1 * | 1/2002 | Armato et al. | 382/131 |
| 2002/0076116 A1 * | 6/2002 | Eschbach | 382/260 |
| 2002/0136453 A1 * | 9/2002 | Aggarwal et al. | 382/166 |
| 2002/0159648 A1 * | 10/2002 | Alderson et al. | 382/260 |
| 2002/0176113 A1 * | 11/2002 | Edgar | 358/3.27 |
| 2003/0118226 A1 * | 6/2003 | Winsor et al. | 382/132 |
| 2003/0161547 A1 * | 8/2003 | Luo | 382/274 |
| 2004/0184672 A1 * | 9/2004 | Murakami | 382/274 |
| 2004/0264799 A1 * | 12/2004 | Gallagher et al. | 382/265 |
| 2005/0073702 A1 * | 4/2005 | Shaked et al. | 358/1.9 |
| 2005/0083054 A1 * | 4/2005 | Feiweier et al. | 324/307 |
| 2005/0273011 A1 * | 12/2005 | Hattery et al. | 600/476 |
| 2006/0093236 A1 * | 5/2006 | Drezner et al. | 382/272 |
| 2006/0233454 A1 * | 10/2006 | Cheng et al. | 382/274 |
| 2006/0233455 A1 * | 10/2006 | Cheng et al. | 382/274 |
| 2007/0009145 A1 * | 1/2007 | Winsor et al. | 382/132 |
| 2007/0086640 A1 * | 4/2007 | Luo et al. | 382/132 |
| 2008/0292194 A1 * | 11/2008 | Schmidt et al. | 382/217 |
| 2009/0046915 A1 * | 2/2009 | Hou et al. | 382/131 |

OTHER PUBLICATIONS

Cohen, M.; DuBois, R.; Zeineh, M.; "Rapid and Effective Correction of RF Inhomogeneity for High Field Magnetic Resonace Imaging," 2000, Wiley-Liss, Human Brain Mapping 10, pp. 204-211.*

* cited by examiner

METHOD FOR CORRECTING INHOMOGENEITIES IN AN IMAGE, AND AN IMAGING APPARATUS THEREFOR

The present application hereby claims priority under 35 U.S.C. §119 on German patent application number DE 10 2004 061 507.1 filed Dec. 21, 2004, the entire contents of which is hereby incorporated herein by reference.

FIELD

The present invention generally relates to a method for correcting inhomogeneities in an image, the image being recorded by an imaging apparatus from an examination object. The invention likewise generally relates to an imaging apparatus for recording an image, in particular an MR image, that has been recorded by a magnetic resonance apparatus. The method may be applied, in particular, in correcting MR images.

BACKGROUND

Magnetic resonance apparatuses are being used ever more frequently to solve various problems, imaging methods of magnetic resonance apparatuses being based on the fact that high frequency pulses (HF pulses) excite the nuclear spins, present in the human body, of hydrogen protons. These nuclear spins excited by high frequency pulses relax back into their original position, it being possible to detect the change in magnetization with the aid of various coils.

Attempts are also being made to use magnetic resonance apparatuses with a higher magnetic basic field strength $B_0$, since it is possible thereby to amplify the recorded signal and enhance the spatial resolution. However, the use of magnets with a higher field strength also leads to the problem of fluctuation in the signal intensity imaged in the MR image. These intensity fluctuations are based chiefly on the fact that the irradiated HF field interacts with the body being examined.

Very uniform high frequency fields can be produced in vacuo or in nonconducting materials. These uniform high frequency fields are necessary for the uniform excitation of the nuclear spins present in the examination object. However, biological materials have dielectric properties that result in the effective high frequency field becoming a function of frequency and nonuniform such that it is no longer possible for the nuclear spins in a predetermined slice of the examination object to be excited homogeneously (bias field). This nonuniformly produced transverse magnetization is detected by the receiving coils and leads to intensity fluctuations and even to signal failures in the MR image such that it is no longer possible to diagnose in this area of the MR image. The frequency of the irradiated HF pulses is directly proportional to the basic field strength, and so these HF-induced inhomogeneities occur in an amplified fashion given strong $B_0$ fields.

U.S. Pat. No. 6,208,138 B1 describes a correction method for eliminating inhomogeneities in an MR image, a logarithm being applied to the MR image, the inhomogeneities being removed, and the image subsequently being resubjected to an exponential calculation. This type of image processing with the use of homomorphic filters is based on the fact that the inhomogeneity is superposed over the image as a spatially dependent multiplier, that is to say the original intensity is multiplied by an inhomogeneity profile. Owing to the application of a logarithm, this multiplication is converted into an addition and can easily be removed or filtered out from the image. The signal intensities are exponentiated after the removal of the inhomogeneity component in order to cancel once again the previously applied logarithm step.

SUMMARY

An object of at least one embodiment of the present invention is to further improve the correction of inhomogeneities in an image.

An example method of at least one embodiment of the invention for correcting inhomogeneities in an image that has been recorded by an imaging apparatus from an examination object, includes the following.

Firstly, the image to be corrected is recorded by the imaging apparatus. Next, a correction image is calculated from the image to be corrected and, subsequently, the recorded image is corrected with the aid of the correction image in order to produce a normalized image by multiplying the correction image by the image to be corrected. During the calculation of the correction image, the pixels in the vicinity of the imaged examination object are preferably identified with the aid of a signal intensity that is lower than a predetermined limiting value. Subsequently, these pixels are assigned signal intensities that are a function of the signal intensity of the pixels of the respective neighborhood.

As a result, no pixels with a very low or no signal intensity are used in the correction image. This is based on the finding that pixels with a very low signal intensity or without a signal intensity also cannot contain any information relating to the inhomogeneity to be corrected. However, it is necessary to know about the characteristic of the inhomogeneity over the image in order to remove the inhomogeneities from the recorded image. A better statement about the characteristic of the inhomogeneity over the image can be produced owing to the fact that these pixels are not used when calculating the inhomogeneity distribution over the image.

The statement relating to the inhomogeneity profile over the image can be decisively improved by replacing the signal intensities in these "noise pixels" by signal intensities from the surroundings. This is also based on the finding that the inhomogeneity profile over the image usually changes only with a low frequency, that is to say there are no very abrupt high frequency changes in the inhomogeneity. Owing to this fact, it is possible to make more accurate statements relating to the intensity characteristic caused by the inhomogeneity such that a correction of the image is also subsequently better possible when the characteristic of the inhomogeneity over the image is better known.

In one example embodiment, the image to be corrected is an MR image that is recorded by a magnetic resonance apparatus or a magnetic resonance tomograph, the corrections correcting inhomogeneities that result from inhomogeneities during excitation of the nuclear spin by high frequency pulses in the examination object. As mentioned at the beginning, particularly given relatively high basic field strengths the interaction of high frequency pulses with the body to be examined leads to inhomogeneities in the MR image that can be corrected successfully with the above method. Although the method has been developed for the correction of inhomogeneities that were caused by the transmitter coils and dielectric resonances, it is capable of correcting all other inhomogeneities (for example caused by the receiving coils).

Of course, the above correction method is not limited to being applied with MR images. The above correction method can be applied whenever an inhomogeneity profile varies multiplicatively with the ideal intensity characteristic, caused by the recorded object, and when it is known that this inhomogeneity profile changes only with low frequency components.

It is preferred to compile a correction copy from the image to be corrected for the purpose of calculating the correction image, this correction copy being able to have a lower resolution than the image to be corrected. The use of a correction copy with a lower resolution than the original image serves the purpose only of accelerating the computing speed during the subsequent arithmetic operations that are applied to the image. The use of a lower resolution does not have a negative influence on the calculation of the inhomogeneity profile, but does shorten the computing time considerably and, for example, can diminish the resolution in that the number of the pixels is reduced by a factor that is between 10 and 100. The resolution of the correction copy can be, for example, 64×64 pixels.

Subsequently, in a further embodiment of the invention, a normalized correction copy can be calculated by using homomorphic filters that are applied to the correction copy. Owing to the use of homomorphic filters, the multiplicative inhomogeneity component in the image can be separated by logarithmization into two components, and the inhomogeneity component can subsequently be filtered out more effectively.

A correction function is formed from the normalized correction copy and from the correction copy by calculating the quotient of a normalized correction copy and the correction copy. This correction function corresponds to the inverse of the inhomogeneity profile. The correction image is subsequently formed from the correction function by interpolation until the resolution of the image to be corrected is obtained again. The normalized image without inhomogeneities is subsequently obtained by multiplying the correction image by the recorded image, the correction image representing the inverse function of the inhomogeneity field such that the influencing of the image by the inhomogeneity profile can be removed from the image.

The following steps are preferably carried out in order to calculate the normalized correction copy: firstly, the logarithm of the correction copy is calculated. Subsequently, the logarithmized image is subjected to a Fourier transformation. Finally, the image is multiplied in the Fourier space by a highpass filter that suppresses the low frequencies partially or completely. Subsequently, the filtered Fourier transform is backtransformed from the Fourier space into the image space, and the backtransformed image must be exponentiated, as a result of which the normalized correction copy is obtained. The Fourier transformation enables a componentwise processing of the respective frequency spectrum of the images, since the images have been previously logarithmized. Consequently, the Fourier transformation can be applied to every component. Exponentiating the result cancels the logarithm step applied at the beginning, and so a normalized correction copy is subsequently obtained.

In order to obtain a good statement relating to the characteristic of the inhomogeneity over the image, the pixels with a very low signal intensity must, however, firstly be replaced. These pixels do not reveal anything about the inhomogeneity profile. For this reason, they must be replaced before a correction copy is compiled. It is preferred for this purpose that in the case of pixels in the interior of the examination object whose signal intensity is lower than the limiting value, the signal intensities are replaced by intensity values that are a function of the signal intensities of in each case N adjacent pixels. For example, the signal intensity can be replaced by the intensity values of the adjacent 25 pixels. The number N can be selected here at will, and is preferably between 10 and 50.

The pixels outside the examination object can also be identified. Of course, these pixels do not obtain a signal from the examination object, and therefore are likewise below the limiting value. The signal intensities of these pixels can be determined in the following way: determining the centroid of the examination object and reflecting the signal intensities in a radially outward fashion from inside the object to outside the examination object, the pixels being reflected on an axis that runs at the edge of the examination object toward the image background.

Likewise, the signal intensities of the pixels can be determined outside the examination object by virtue of the fact that, starting from the examination object, the pixels are filled outside with signal intensities that are given by the mean value of M adjacent pixels. Here, the process is from the examination object outward. Here, M can equally be selected at between 10 and 50, for example 25, so that the pixels in the background are filled with the mean value of the next 25 pixels. It is possible thereby to proceed outward from the pixel to be replaced, for example helically until M pixels are found that have an intensity value above the limiting value. Furthermore, it is possible to select the signal intensity of the pixels outside the examination object with the aid of a mean value of all the signal intensity points inside the examination object.

All the pixels with a signal intensity below a threshold value should preferably be filled with other signal intensities. The averaging method in the vicinity of the examination object should thereby be more accurate than at the edge of the image. Filling up the signal intensities in the "noise pixels" is optimized as a function of the computing time. More accurate approximation methods require longer computing times, while other approximation methods are quicker, but less accurate.

In accordance with one example embodiment, in order to compile the correction image the image is enlarged by respectively reflecting outward at the edges image strips at the outer edges, typically approximately 25% of the total image or the field of view. The spectra are imaged periodically by the discrete Fourier transformation used in the image processing. This can lead to the occurrence of sharp jumps in the inhomogeneity profile at the edges of the images of the inhomogeneity profiles. These jumps cannot be described with low frequency components, and so a correction at these edges does not operate reliably. For this reason, the outer image areas are reflected outward such that this problem is displaced further outward, the areas displaced outward not being used at the conclusion when calculating the inhomogeneity profile or the inverse inhomogeneity profile. If, for example, the resolution of the copy is 64×64 pixels, it can amount to 96×96 pixels after the reflection.

At least one embodiment of the invention also relates to an imaging apparatus for recording an image of an examination object, having an image recording unit for recording an image to be corrected, a correction copy calculating unit for calculating a correction copy, a filter unit for calculating a normalized correction copy, and a correction calculating unit for calculating a correction image, the correction image being calculated as explained above.

BRIEF DESCRIPTION OF THE DRAWINGS

Example embodiments of the invention are explained in more detail below with reference to the attached drawings, in which.

DETAILED DESCRIPTION OF THE EXAMPLE EMBODIMENTS

Figure 1:
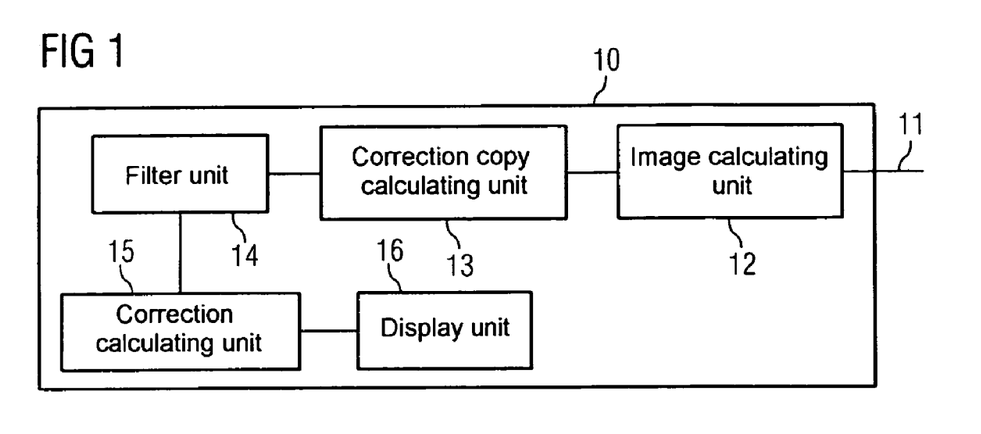
FIG. 1 shows a schematic of an imaging apparatus that can correct inhomogeneities.

FIG. 1 shows a schematic of an imaging apparatus 10, for example a magnetic resonance apparatus. The fundamental mode of operation of a magnetic resonance apparatus is known to the person skilled in the art and plays no further role in understanding embodiments of the present invention, for which reason a more accurate explanation is dispensed with. The measuring signals detected after excitation by a high frequency pulse and which have been received by a receiving coil are fed via a line 11 to an image calculating unit 12 that calculates an MR image in the conventional way from the signals detected by the coils.

This MR image has, inter alia, inhomogeneities (a so-called bias field). In order to remove these inhomogeneities in the MR image, the MR image output by the image calculating unit 12 is fed to a correction copy calculating unit 13 that calculates a correction copy. As explained later in detail, the correction copy is prepared in the unit 13 in such a way that the pixels with low signal intensity are removed and replaced by other signal intensities. A filter unit 14 subsequently suppresses the low frequency inhomogeneity component from the MR image, and a correction calculating unit 15 uses the data from the correction copy to calculate the inverse inhomogeneity distribution from the data transferred by the filter unit. The normalized MR image can subsequently be calculated therefrom. Finally, this normalized MR image can be displayed on a display unit 16, or can be used for further qualitative calculating operations.

Figure 2:
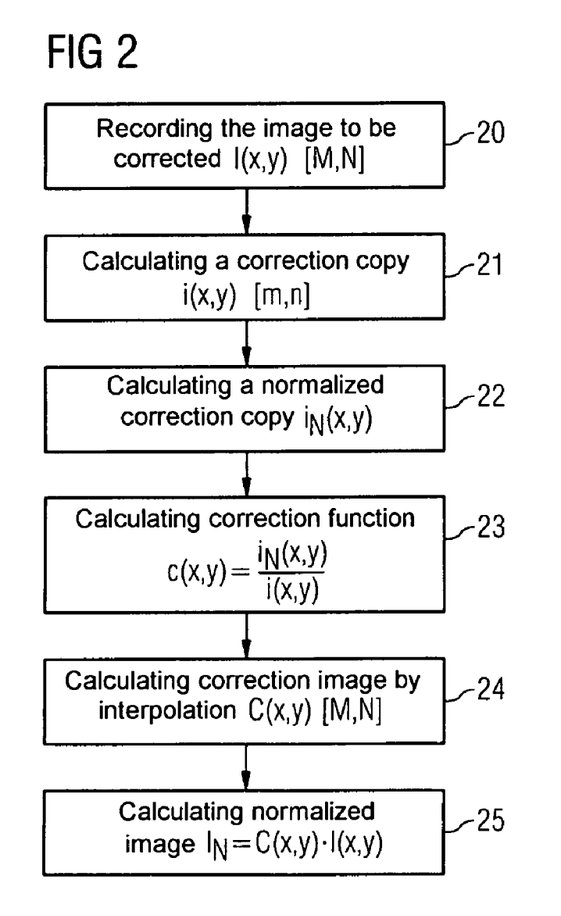
FIG. 2 shows a flowchart that shows the method steps for calculating a normalized image.

FIG. 2 illustrates the basic steps for producing a normalized image. The image I(x, y) to be corrected, which has the dimensions [M, N], is recorded in a first step 20. The dimensions of the MR image usually correspond to dimensions used in MR images, for example 256×256 or 512×512 pixels.

A correction copy i(x, y) is subsequently calculated in step 21, the image size being [m, n] here. The correction copy can theoretically correspond to the image to be corrected in the number of pixels, but an image with a lower resolution is mostly produced in order to shorten the computing time. This diminution of the resolution shortens the computing time to a large part, but does not substantially influence the accuracy in the removal of inhomogeneities. A normalized correction copy $i_N(x, y)$ is subsequently produced from the correction copy in a step 22. Finally, a correction function c(x, y) with $$c = \frac{i_N(x, y)}{i(x, y)}$$

can be formed from the normalized correction copy $i_N(x, y)$ and the correction copy i(x, y).

The inverse function of the inhomogeneity field is produced in this step 23. Finally, the correction image C(x, y) that has the same dimensions M, N as the image to be corrected is calculated in step 24 by interpolation. The normalized image can subsequently be calculated in step 25 by multiplying the correction image C(x, y) by the image I(x, y) to be corrected. The field inhomogeneity caused by the high frequency field is removed from the normalized image by multiplying by the correction image. Two-dimensional data have been used in the present example; however, the present method can also be applied to three-dimensional volume data records.

Figure 3:
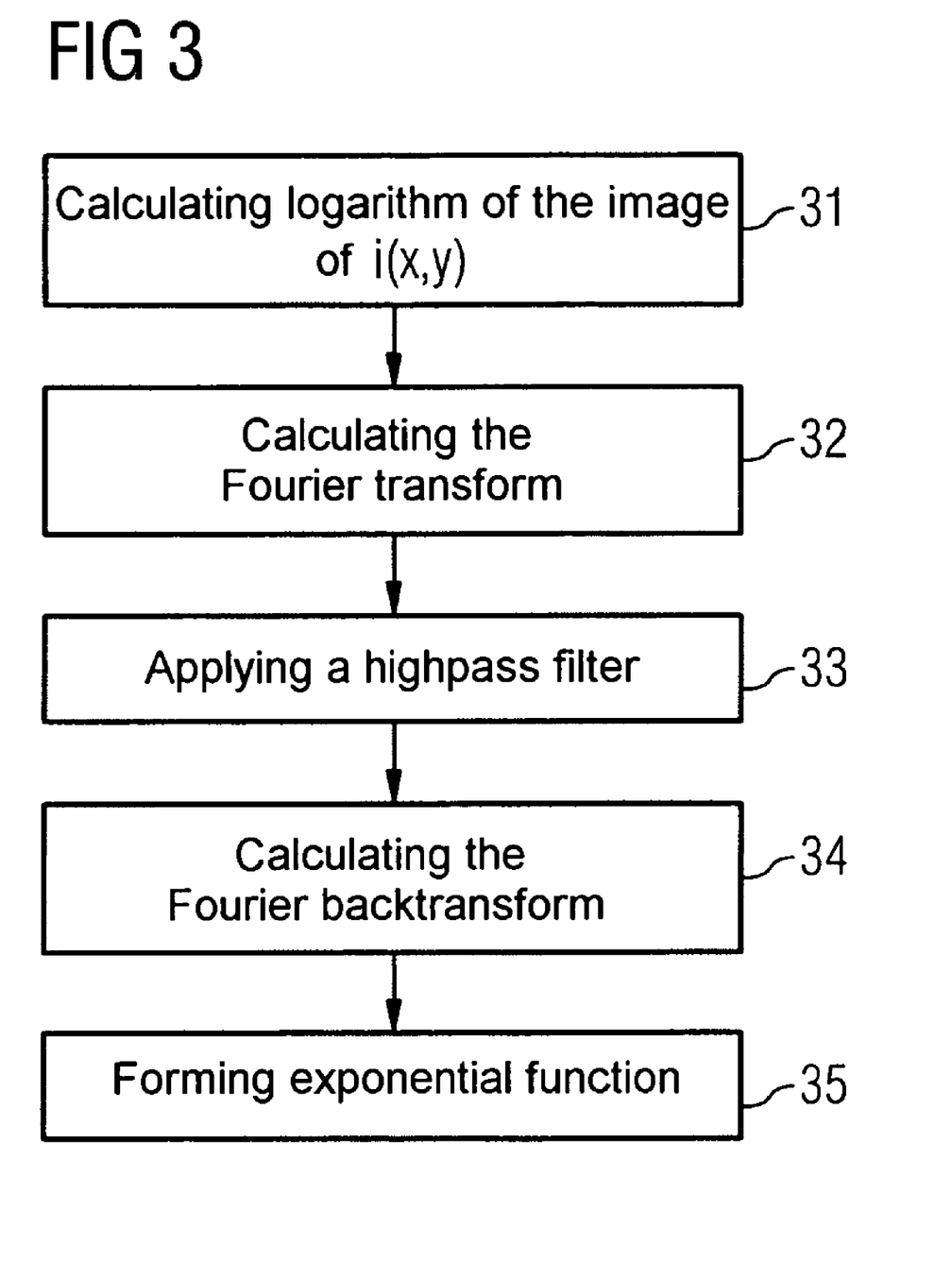
FIG. 3 shows a flowchart that shows the steps for calculating a normalized correction copy.

It is clearly shown in FIG. 3 how a normalized correction copy is formed from the correction copy as is performed in the filter unit 14 of FIG. 1. This sequence of the homomorphic filter is as follows. The logarithm of the image i(x, y) is calculated in a first step 31, and the Fourier transformation back into the Fourier or K space is then formed in step 32. A highpass filter (notch filter) that filters out the low frequency component of the inhomogeneity is subsequently applied in step 33 to the signal in the Fourier space. A backtransformation into the image space before exponentiation of the MR image in step 35 is subsequently performed in step 34. A normalized correction copy $i_N(x, y)$ of low resolution is now obtained in step 35.

Figure 4:
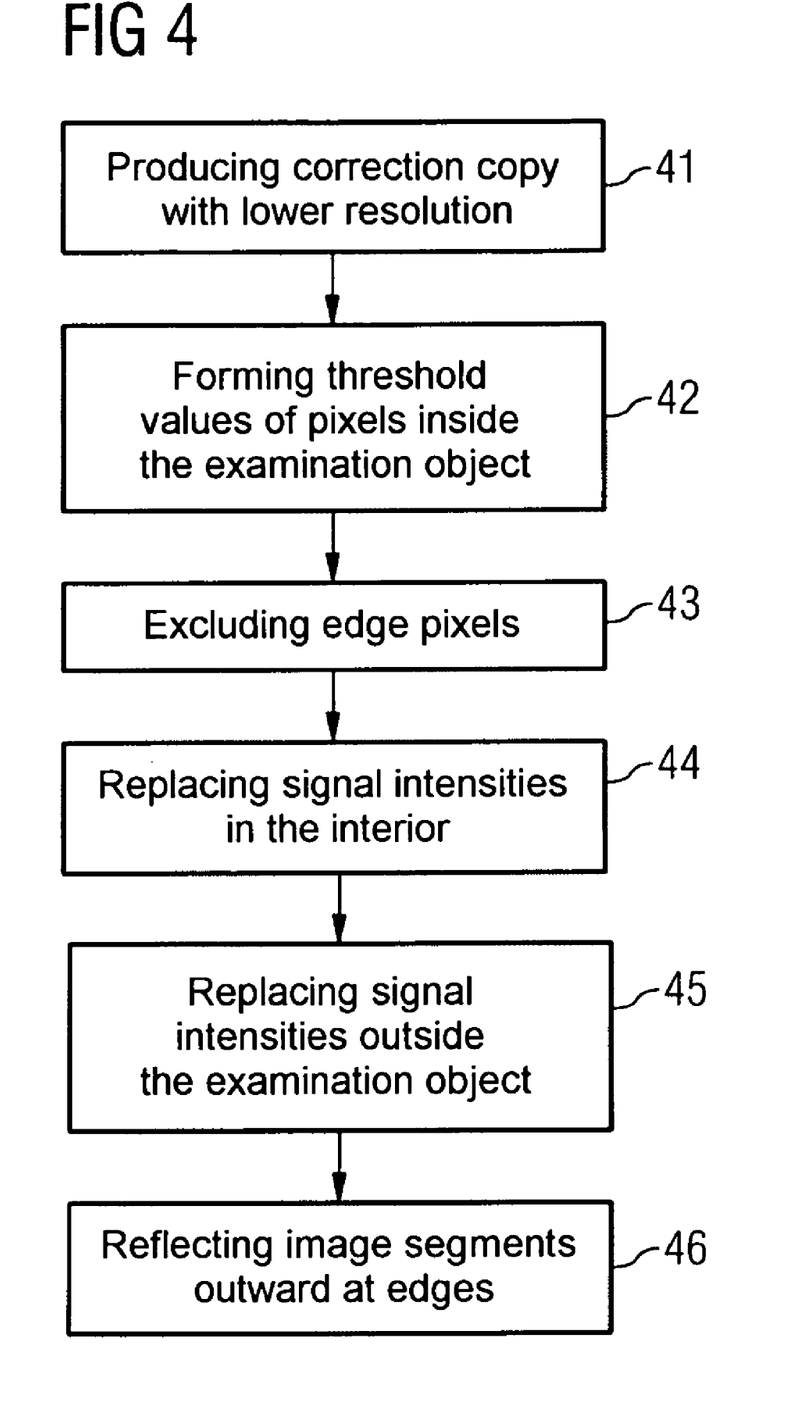
FIG. 4 shows a flowchart with the steps for preparing the correction copy.

FIG. 4 illustrates the steps of how the MR image coming from the image calculating unit 12 is prepared before the steps shown in FIG. 3 are executed. Firstly, a correction copy with a lower resolution, that is to say with fewer pixels, is generated in a step 41. A threshold image is formed in a step 32, that is to say the pixels with a signal intensity below a threshold value are rejected. Pixels at the edge of the examination object are further rejected in a step 43, since these deliver false results owing to the so-called partial volume effect.

Subsequently, in step 44, the pixels with an excessively low intensity that lie in the interior of the examination object are identified and their signal intensity is replaced, for example by averaging the next N adjacent pixels. The signal intensities in the pixels outside the examination object are further replaced in a step 45. As will still be explained in detail later, here either the pixels inside the examination object are reflected outward radially from the center of the examination object, the reflection axis running at the edge of the examination object, or all the pixels inside a given distance away from the examination object, for example ⅛ of the field of view, are changed by giving the signal intensities of these pixels by signal intensities of the next M pixels. Likewise, or in addition, if not all the pixels in the background have already been replaced, the remaining pixels of the background can be filled with a mean value of the signal intensity of the examination object.

Finally, image segments are reflected outward at the edges in a step 46, as a result of which any problems arising in the inhomogeneity profile at the edges are displaced outward.

FIGS. 5 to 11 show the method steps for removing the field inhomogeneities with reference to the example of an MR picture of a head.

Figure 5:
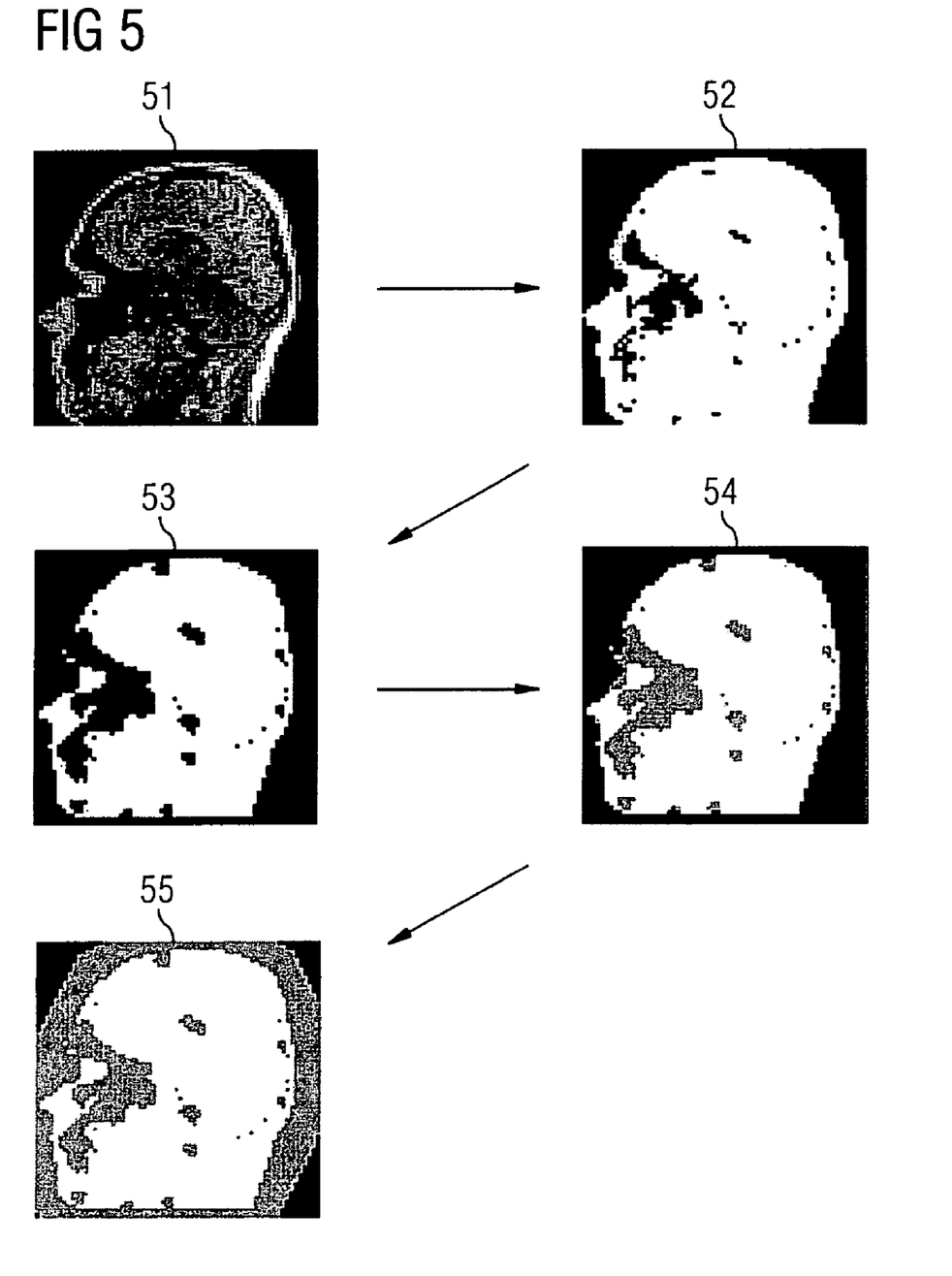
FIGS. 5 to 11 show the various steps for calculating a normalized image with the aid of an example image.

In FIG. 5, image 51 shows an MR image with low resolution that was produced from the image to be corrected. The image 51 is subjected to a threshold value method which results in image 52, in which all the pixels with a signal intensity below a threshold value inside and outside the examination object are identified. Subsequently, pixels at the edges are further removed in image 53 at the transition between pixels with a signal intensity and without a signal intensity, since these pixels likewise also falsify the result during calculation of the inhomogeneity. Subsequently, in image 54 the pixels in the interior of the examination object whose signal intensity was previously too low are replaced, for example by averaging with the aid of the nearest 25 pixels.

Subsequently, in image 55 the pixels in the vicinity of the examination object can likewise be replaced by averaging the nearest M pixels, it being possible to select M between 10 and 50.

Figure 6:
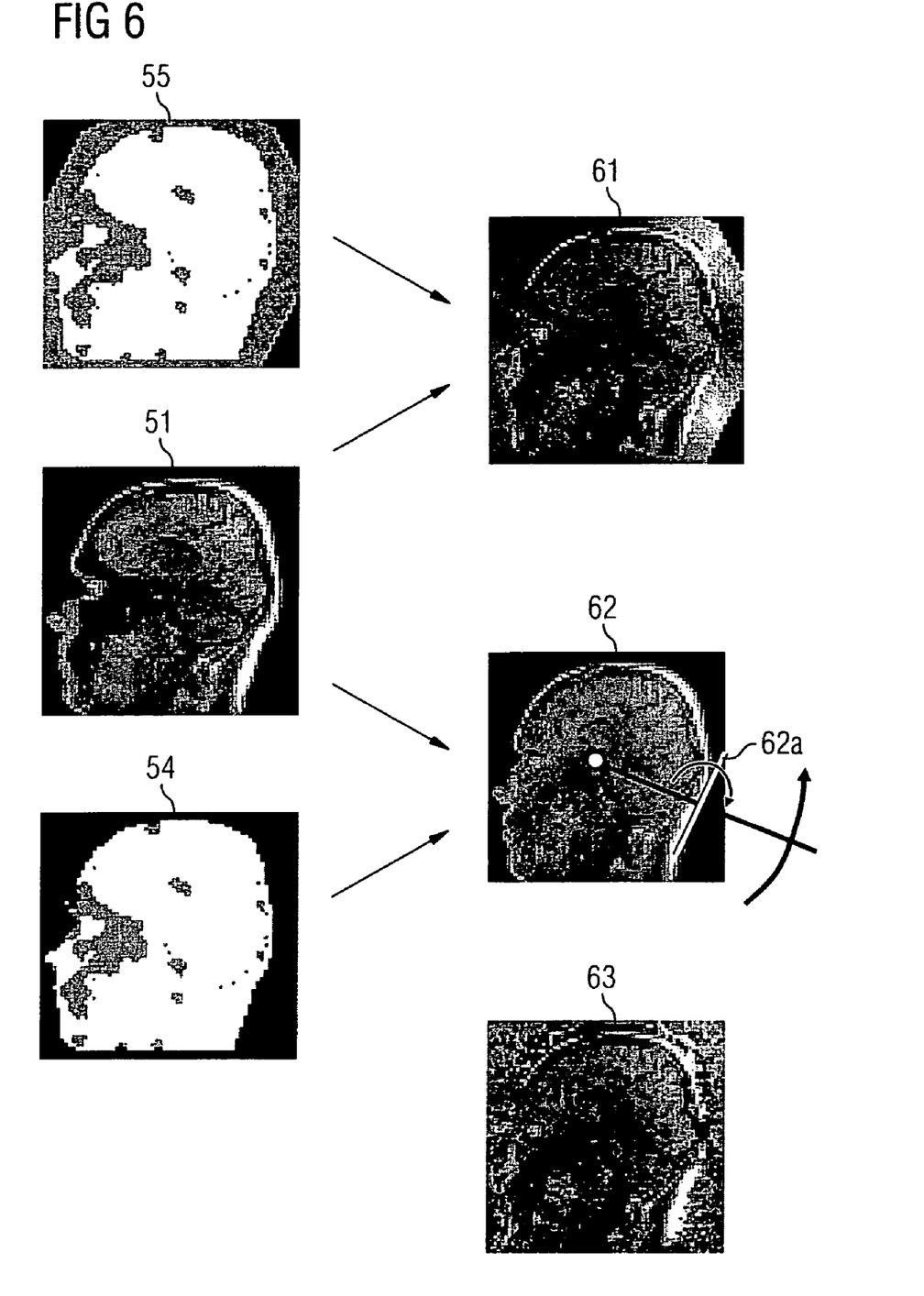

As illustrated in FIG. 6, the image 61 can now be produced from image 55 and the original image 51, as shown in image 55 the pixels from image 51 with an excessively low signal intensity having been replaced. Likewise, in accordance with another possibility the image 51 can be mixed with image 54, only the pixels in the interior being replaced in order to obtain image 62. The pixels outside the examination object are calculated here by point reflection radially outward from the centroid of the examination object. The pixels that lie in the examination object are now reflected outward on a reflection axis 62a such that the image 63 is obtained. This point reflection radially outward is carried out for all the pixels in the background.

Either image 61 or image 63 can be used for the further processing, that is to say the image 51 can be mixed either with the mask 55 or the mask 54. Whether image 61 or image 63 is actually used for the further processing can be a function of the examination object, the coils used and other factors.

Figure 7:
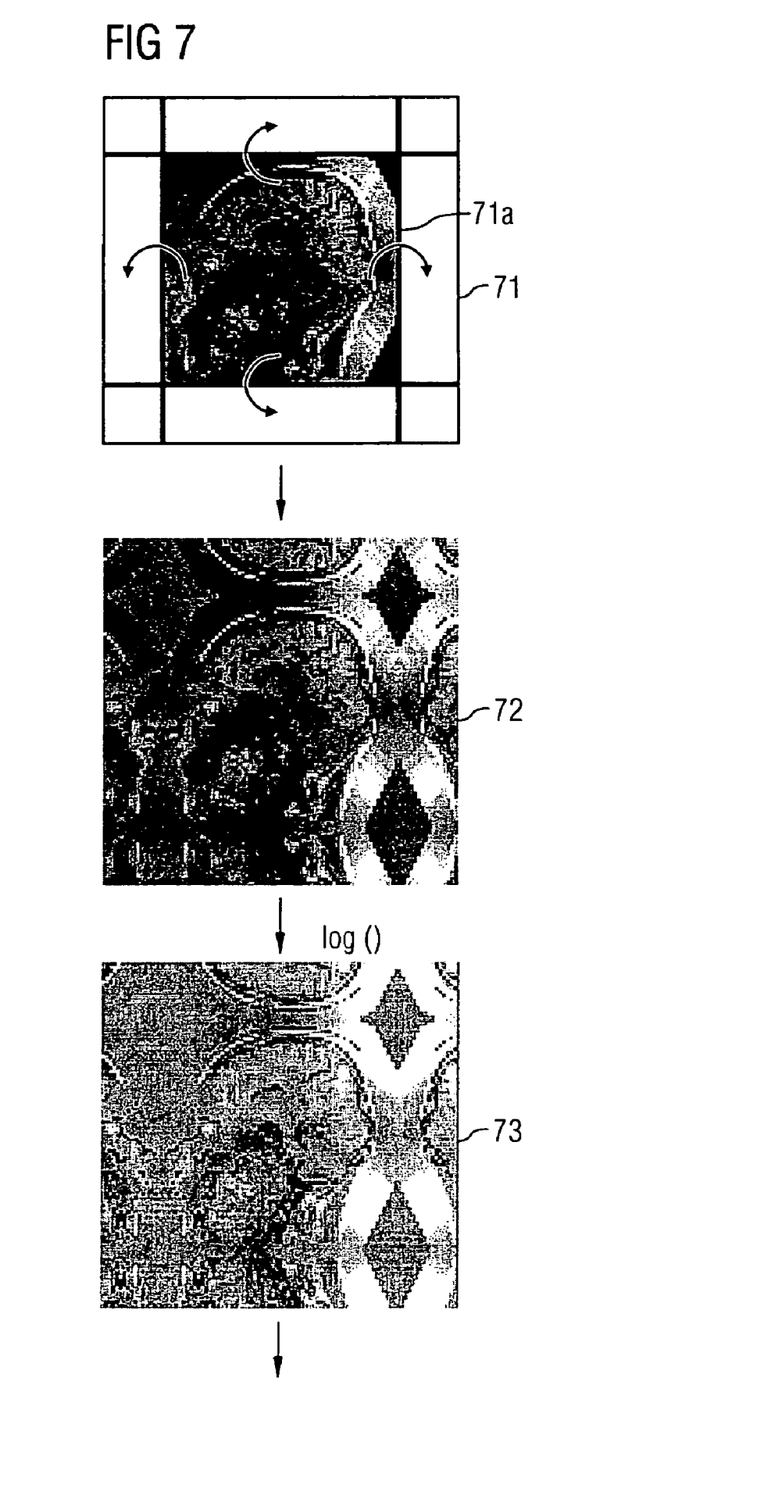

As shown in FIG. 7, image 61 is subsequently used for the further processing. The discrete Fourier transformation used in the image calculation produces periodic spectra. The inhomogeneities are likewise periodic. The inhomogeneity profile can therefore have jumps over the image. These jumps or edges cannot be approximated with the aid of low frequencies, and so the inhomogeneity profile at the edges cannot be correctly described. For this reason, the outer image segments are respectively reflected outward at the edges 71a, as is to be seen in image 71. These discontinuities are displaced outward by this reflection, and are not taken into account there later.

Image 72 results from reflecting image segments, for example 25% of the entire field of view. This image 72 is the correction copy that is calculated in the correction copy calculating unit 13 and fed to the filter unit 14. There, the logarithm of the image 72 is formed, and image 73 is obtained.

Figure 8:
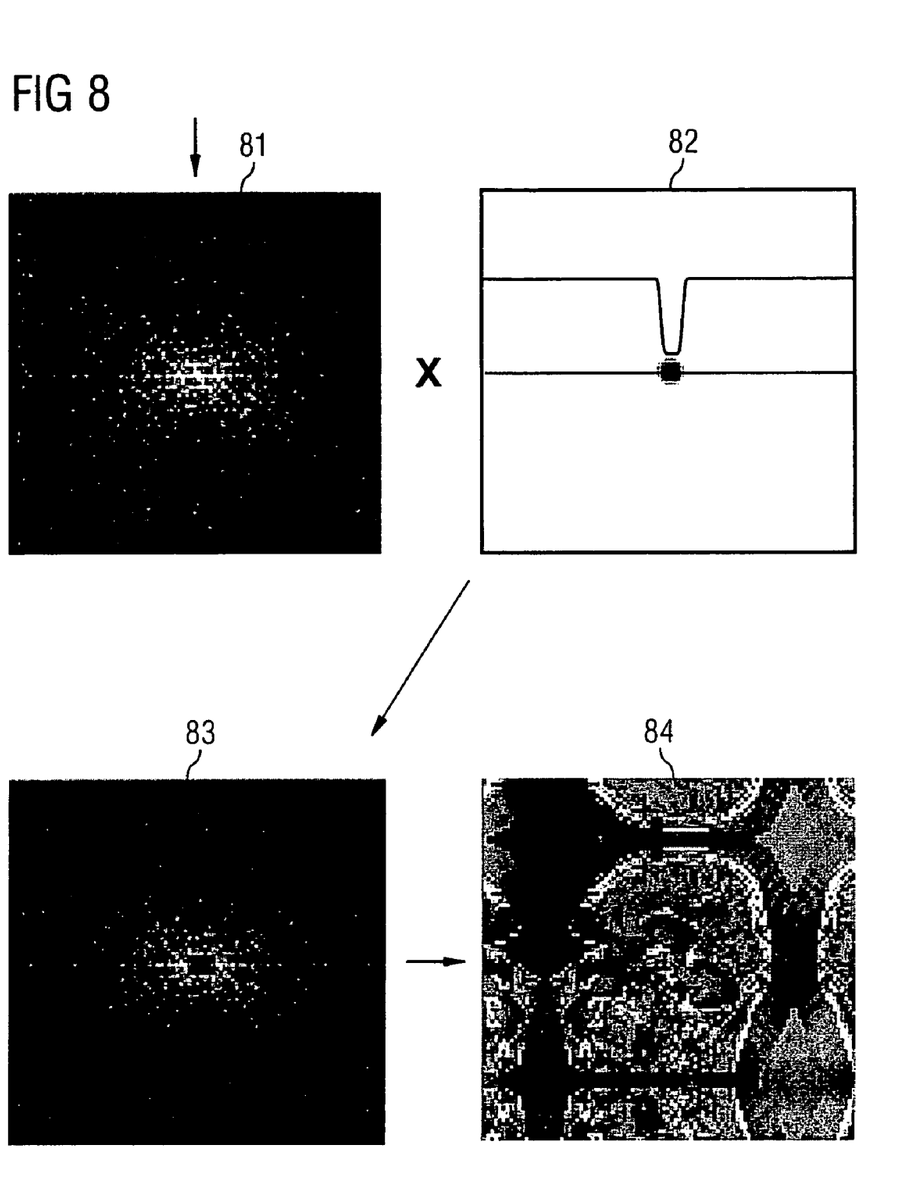

A two-dimensional inverse Fourier transformation of this image 73 is subsequently carried out in order to obtain image 81, as is to be seen in FIG. 8. As shown in image 82, this frequency spectrum 81 is multiplied by a highpass filter, as a result of which image 83 is obtained from having filtered out the low frequency component in the middle of the image. This frequency spectrum of image 83 is subsequently backtransformed into the image space, thus resulting in image 84. Image 84 is finally exponentiated in order to obtain image 85.

Figure 9:
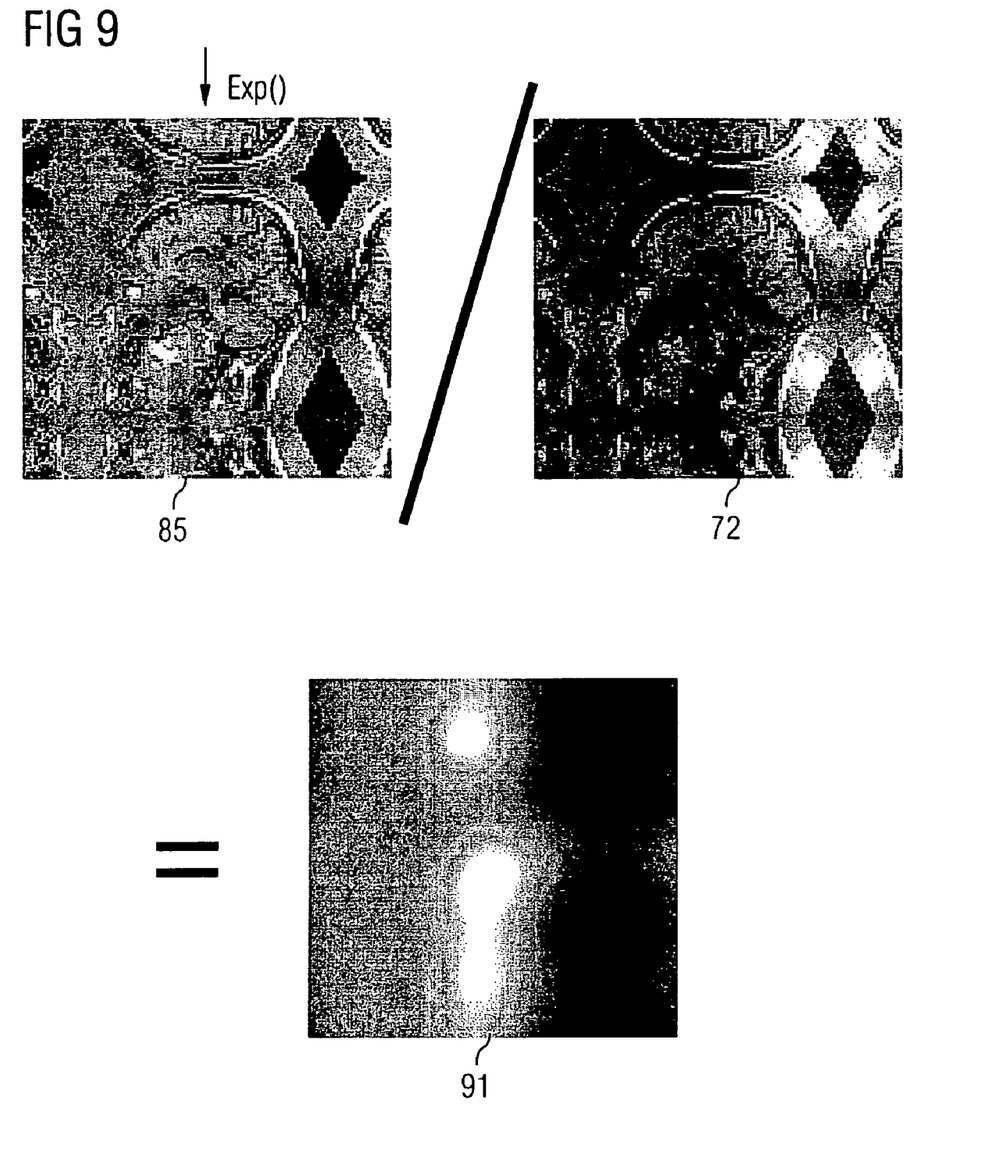
Figure 10:
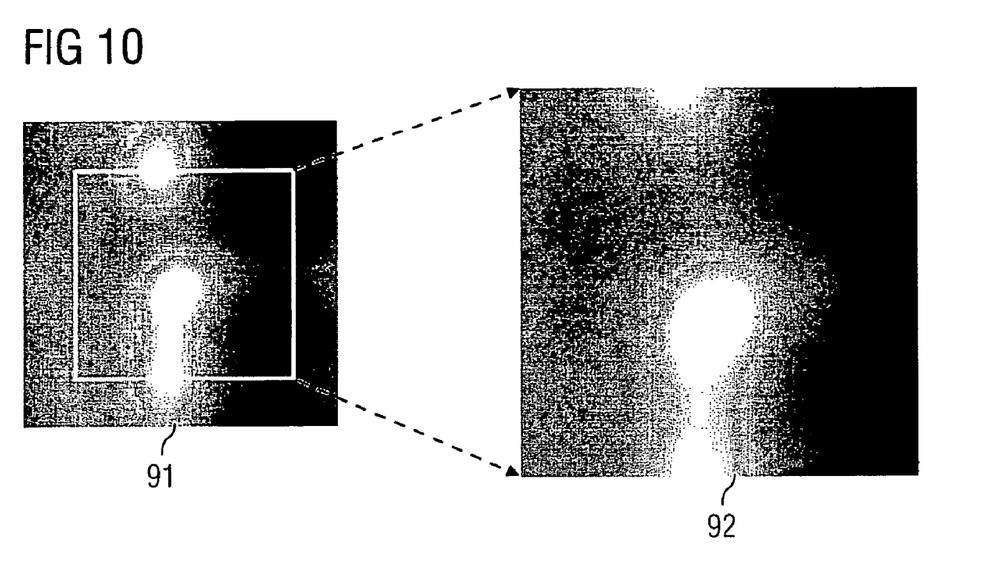

The inhomogeneities that have been filtered out by the Fourier transformation and the subsequent highpass filtering are now suppressed in image 85 such that the low frequency inhomogeneities in the image have been greatly reduced. Image 85 corresponds to the normalized correction copy $i_N(x, y)$. The correction function 91 can be obtained by forming the quotient of the normalized correction copy 85 $i_N(x, y)$ and the correction copy $i(x, y)$, that is to say image 72. The correction function corresponds to the inverse function of the inhomogeneity with a lower resolution. As illustrated in FIG. 10, the inner portion of image 91 is now taken, since the added outer area of image 71 is not required on image 72.

Figure 11:
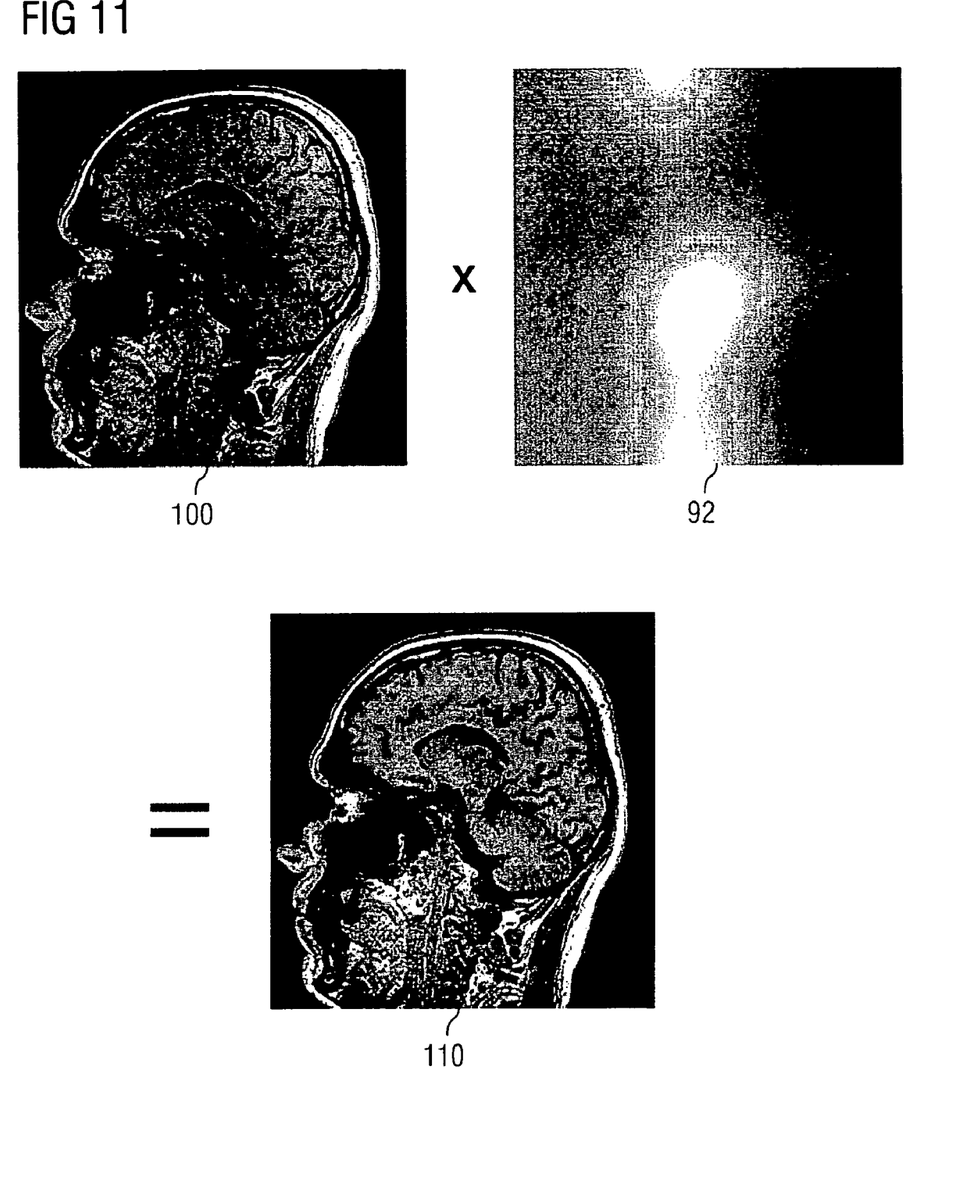

Subsequently, the image is interpolated to its original dimension such that image 92 is obtained, and this has the same dimension [M, N] as the image to be corrected. This correction image 92 shows the inverse of the inhomogeneity profile. Using the correction image 92 to multiply the image 100 originally to be corrected delivers the normalized image 110, which is almost free of inhomogeneities resulting from resonances of the irradiated high frequency field with the examination object.

In summary, the method of at least one embodiment described here permits a correction of inhomogeneities in images. The pixels with too low a signal intensity that reveal nothing about the inhomogeneity profile are extracted by the preparation of the images before the filtering and replaced by pixels from the neighborhood. This enables an accurate statement relating to the inhomogeneity profile such that the latter can subsequently be used to produce a normalized image.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for correcting an image of an examination object, the method comprising:
   recording the image;
   calculating a correction image from the recorded image; and
   correcting the recorded image to produce a normalized image by multiplying the correction image by the recorded image, wherein when calculating the correction image, the pixels in the vicinity of the imaged examination object are identified using a signal intensity that is lower than a limiting value, and wherein the identified pixels are allocated signal intensities that are a function of the signal intensity of the pixels in the respective neighborhood.

2. The method as claimed in claim 1, wherein an MR image is recorded by a magnetic resonance apparatus, the corrections correcting inhomogeneities that result in the examination object owing to inhomogeneities during the excitation of the nuclear spin by high-frequency pulses.

3. The method as claimed in claim 1, further comprising:
   compiling a correction copy from the recorded image.

4. The method as claimed in claim 3, wherein a normalized correction copy is calculated by using homomorphic filters that are applied to the correction copy.

5. The method as claimed in claim 4, wherein a correction function is formed by calculating the quotient of the normalized correction copy and the correction copy.

6. The method as claimed in claim 5, wherein the correction image is formed from the correction function by interpolation until the correction image has the same resolution as the recorded image.

7. The method as claimed in claim 4, wherein the calculating the normalized correction copy includes:
   calculating a logarithm of the correction copy,
   calculating a Fourier transformation into the Fourier space of the logarithmized image,
   multiplying the Fourier transform by a highpass filter,
   backtransforming the filtered Fourier transform from the Fourier space into the image space, and forming an exponential function of the backtransformed image, as a result of which the normalized correction copy is obtained.

8. The method as claimed in claim 1, wherein, in the case of pixels in the interior of the examination object whose signal intensity is lower than the limiting value, the signal intensities are replaced by intensity values that are a function of the signal intensities of in each case N adjacent pixels.

9. The method as claimed in claim 1, wherein, in the case of pixels outside the examination object and having signal intensities below the limiting value, the signal intensity is determined in the following way:
determining the centroid of the examination object, and
reflecting signal intensities from inside the object to outside the examination object in a radially outward fashion on a reflection axis that runs at the edge of the examination object toward the image background.

10. The method as claimed in claim 1, wherein, in the case of pixels outside the examination object and having signal intensities below the limiting value, the signal intensity is determined in the following way:
determining with the aid of the mean value of M adjacent pixels the signal intensities of pixels that lie within a predetermined distance from the examination object.

11. The method as claimed in claim 1, wherein the signal intensity of pixels outside the examination object is selected with the aid of a mean value of the signal intensity of the pixels within the examination object.

12. The method as claimed in claim 1, wherein, in order to compile the correction image, an enlarged image of the image to be corrected is produced by respectively reflecting outward at the edges image strips at the outer edges of the image.

13. An imaging apparatus for recording an image of an examination object, comprising:
an image recording unit to record an image to be corrected;
a correction copy calculating unit to calculate a correction copy, which produces a correction copy from the recorded image;
a filter unit to calculate a normalized correction copy;
a correction calculating unit to calculate a correction image, which produces a normalized image by multiplying the correction image by the image to be corrected, the correction copy calculating unit identifying, when calculating the correction copy, the pixels in the vicinity of the imaged examination object with a signal intensity that is lower than a limiting value, and allocating these pixels signal intensities that in each case are a function of the signal intensity of the pixels in the respective neighborhood; and
a display unit to display the normalized image.

14. The imaging apparatus as claimed in claim 13, wherein the imaging apparatus is a magnetic resonance apparatus that produces MR images of the examination object on the basis of nuclear magnetic resonance.

15. The method as claimed in claim 1, further comprising:
compiling a correction copy, from the recorded image, with a lower resolution than the recorded image.

16. The method as claimed in claim 2, further comprising:
compiling a correction copy, from the recorded image, with a lower resolution than the recorded image.

17. The method as claimed in claim 2, further comprising:
compiling a correction copy from the recorded image.

18. The method as claimed in claim 17, wherein a normalized correction copy is calculated by using homomorphic filters that are applied to the correction copy.

19. An apparatus for correcting an image of an examination object, comprising:
means for recording the image;
means for calculating a correction image from the recorded image; and
means for correcting the recorded image to produce a normalized image by multiplying the correction image by the recorded image, wherein when calculating the correction image, the pixels in the vicinity of the imaged examination object are identified using a signal intensity that is lower than a limiting value, and wherein the identified pixels are allocated signal intensities that are a function of the signal intensity of the pixels in the respective neighborhood.

20. The imaging apparatus as claimed in claim 19, wherein the imaging apparatus is a magnetic resonance apparatus that produces MR images of the examination object on the basis of nuclear magnetic resonance.

* * * * *